(12) United States Patent
Zhou et al.

(10) Patent No.: US 12,464,696 B2
(45) Date of Patent: Nov. 4, 2025

(54) STATIC RANDOM ACCESS MEMORY DEVICE WITH STACKED FETs

(71) Applicant: INTERNATIONAL BUSINESS MACHINES CORPORATION, Armonk, NY (US)

(72) Inventors: Huimei Zhou, Albany, NY (US); Carl Radens, LaGrangeville, NY (US); Chen Zhang, Santa Clara, CA (US); Junli Wang, Slingerlands, NY (US); Miaomiao Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 18/212,826

(22) Filed: Jun. 22, 2023

(65) Prior Publication Data

US 2024/0431087 A1 Dec. 26, 2024

(51) Int. Cl.
*H10B 10/00* (2023.01)
*H10D 30/01* (2025.01)
*H10D 30/43* (2025.01)
*H10D 30/67* (2025.01)
*H10D 62/10* (2025.01)
*H10D 64/01* (2025.01)
*H10D 84/85* (2025.01)

(52) U.S. Cl.
CPC .......... *H10B 10/12* (2023.02); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/85* (2025.01)

(58) Field of Classification Search
CPC ...... H10B 10/12; H10D 30/014; H10D 30/43; H10D 30/6735; H10D 30/6757; H10D 62/121; H10D 64/017; H10D 84/85; H10D 30/019; H10D 30/501; H10D 62/151; H10D 84/0177; H10D 84/83135; B82Y 10/00
See application file for complete search history.

(56) References Cited

U.S. PATENT DOCUMENTS 8,680,623 B2   3/2014   Frank et al.
8,836,044 B2   9/2014   Wang et al.
9,691,774 B2   6/2017   Liaw
(Continued)

FOREIGN PATENT DOCUMENTS

KR         100197524 B1     6/1999

OTHER PUBLICATIONS

Chen et al., "A 10 nm Si-based Bulk FinFETs 6T SRAM with Multiple Fin Heights Technology for 25% Better Static Noise Margin", Jun. 2013 Digest of Technical Papers—Symposium on VLSI Technology, Conference: Symposium on VLSI Technology, 2013, 3 pages.

*Primary Examiner* — Jonathan Han
(74) *Attorney, Agent, or Firm* — Jeffrey M. Ingalls

(57) ABSTRACT

A semiconductor device is provided. The semiconductor device includes a semiconductor device comprising: a first stacked field effect transistor (FET) structure in a first device area, the first stacked FET structure comprising a first pull down (PD) transistor, and a first pull up (PU) transistor disposed over the first PD transistor, a first metal gate that is shared by the first PD transistor and the first PU transistor; and an oxygen blocking layer provided on the first metal gate.

20 Claims, 15 Drawing Sheets

(56) References Cited

U.S. PATENT DOCUMENTS

| | | |
|---|---|---|
| 11,063,053 B2 | 7/2021 | Liaw |
| 11,508,736 B2 | 11/2022 | Chu et al. |
| 2021/0384139 A1 | 12/2021 | Zhou et al. |
| 2022/0278110 A1 | 9/2022 | Liaw |
| 2022/0352180 A1 | 11/2022 | Lin et al. |
| 2023/0046028 A1 | 2/2023 | Pao et al. |
| 2024/0284653 A1* | 8/2024 | Lin ........................ H10D 89/10 |

* cited by examiner

US 12,464,696 B2

STATIC RANDOM ACCESS MEMORY DEVICE WITH STACKED FETs

BACKGROUND

The present disclosure relates to fabrication methods and resulting structures for semiconductor devices. More specifically, the present disclosure relates to fabrication methods and resulting structures for semiconductor devices including static random-access memory (SRAM) devices with a stacked field effect transistor (FET) structure.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Monolithic stacking of transistors is an attractive architecture for future complementary metal oxide semiconductor (CMOS) scaling, and potentially for ultimately scaled technology. By directly stacking one type of FET (e.g., an n-type FET) over another type (e.g., a p-type FET), significant area scaling can be achieved.

SRAM is a type of random access memory (RAM) that uses latch circuitry (flip-flop) to store each bit. A typical SRAM cell is made up of six FETs. Each bit in a conventional SRAM is stored on four of the transistors that form two cross-coupled inverters. This storage cell has two stable states which are used to denote 0 and 1. Two additional access transistors serve to control the access to a storage cell during read and write operations. In addition to such six-transistor (6T) SRAM, other kinds of SRAM chips use 4, 8, 10 (4T, 8T, 10T SRAM), or more transistors per bit. In certain semiconductor devices that include SRAM devices, controlling the threshold voltage (Vt) shift for the n-type FET (or NFET) and p-type FET (or PFET) structures may be a topic of interest.

SUMMARY

Embodiments of the present disclosure relate to a semiconductor device. A semiconductor device is provided. The semiconductor device includes a semiconductor device comprising: a first stacked field effect transistor (FET) structure in a first device area, the first stacked FET structure comprising a first pull down (PD) transistor, and a first pull up (PU) transistor disposed over the first PD transistor; a first metal gate that is shared by the first PD transistor and the first PU transistor; and an oxygen blocking layer provided on the first metal gate.

Embodiments of the present disclosure relate to a semiconductor device. A semiconductor device is provided. The semiconductor device includes a first stacked field effect transistor (FET) structure in a first device area, the first stacked FET structure comprising a first pull down (PD) transistor, and a first pull up (PU) transistor disposed over the first PD transistor; a first metal gate that is shared by the first PD transistor and the first PU transistor; a pass gate transistor comprising a second metal gate; and an oxygen rich layer provided on the second metal gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
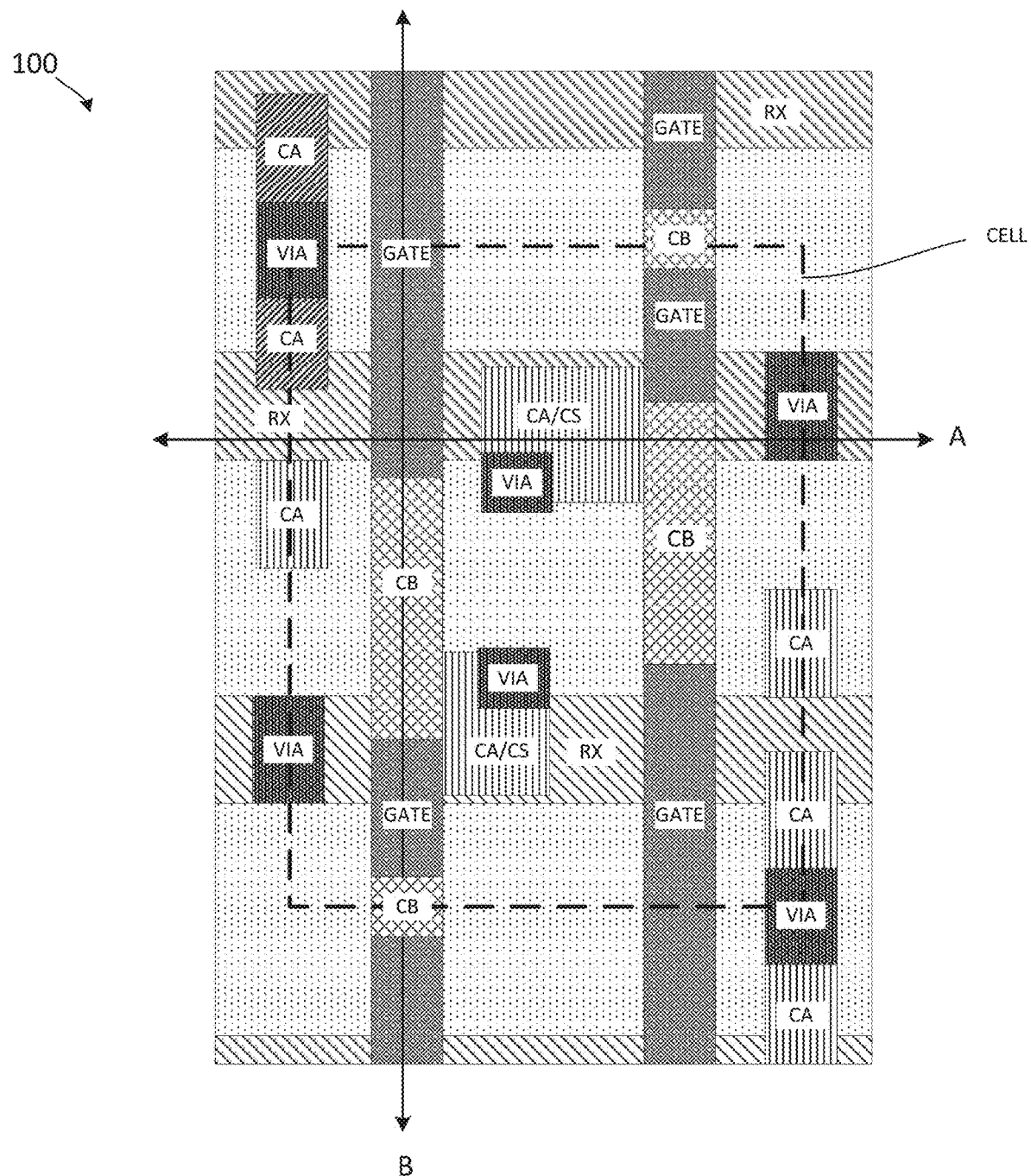
FIG. 1 is a top view of a semiconductor device, according to embodiments.

The present disclosure describes semiconductor devices including SRAM devices, the SRAM devices including stacked FETs, and methods of manufacturing the semiconductor devices. In particular, the present disclosure describes certain embodiments including a first stacked field effect transistor (FET) structure in a first device area, a first metal gate that is shared by the first PD transistor and the first PU transistor, and an oxygen blocking layer provided on the first metal gate. The oxygen blocking layer allows for tuning the Vt to improve the write margin (WRM). The present disclosure also describes certain embodiments including a first stacked field effect transistor (FET) structure in a first device area, the first stacked FET structure comprising a first pull down (PD) transistor, and a first pull up (PU) transistor disposed over the first PD transistor, a first metal gate that is shared by the first PD transistor and the first PU transistor, a pass gate transistor comprising a second metal gate; and an oxygen rich layer provided on the second metal gate. The oxygen blocking layer also allows for tuning the Vt to improve the write margin (WRM).

The flowcharts and cross-sectional diagrams in the Figures illustrate methods of manufacturing stacked FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the particular drawing figures. Several of the figures show different orientation such as the top view, and different cross-sectional views. It should be noted that right and left, or top and bottom, etc. relate to (or depend on) the particular view of each figure. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions.

The wafer footprint of a FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

In certain SRAM devices, the SRAM cell is made up of six MOSFETs, and is often called a 6T SRAM cell. Each bit in the cell is stored on four transistors that form two cross-coupled inverters. In one example, the four transistors that form the cell include a pull up (PU) source transistor, a PU drain transistor, a pull down (PD) source transistor and a PD drain transistor. This storage cell has two stable states which are used to denote 0 and 1. Two additional access transistors serve to control the access to a storage cell during read and write operations. In addition to 6T SRAM, other kinds of SRAM chips use 4, 8, 10 (4T, 8T, 10T SRAM), or more transistors per bit.

In the SRAM devices of the present embodiments, tuning the threshold voltage (Vt) of the NFET and/or PFET regions may allow for improvements in the write margin (WRM) of the SRAM device. In general, write margin is the measure of the ability to write data into the SRAM cell. Write margin voltage is the maximum noise voltage present at bit lines during successful write operation. When noise voltages exceeds the write margin voltage, then write failure occurs.

In certain of the embodiments, described herein, blocking oxygen to the WFM may decrease the NFET Vt and may increase the PFET Vt. By blocking oxygen to the WFM at the pull up (PU) transistor and the pull down (PD) transistor, a weaker PU transistor and a stronger PD transistor may be achieved. In these embodiments, as will be described in further detail herein, a TiN film, for example, can be formed to weaken the PU transistor and strengthen the PD transistor. This allows for tuning the Vt for the NFET and VFET regions to improve the write margin.

In certain of the embodiments described herein, driving more oxygen to the work function metal (WFM) may increase the NFET Vt and decrease the PFET Vt. By driving more oxygen to the WFM at the pass gate (PG) transistor, a weaker PG transistor may be achieved. In these embodiments, as will be described in further detail herein, an oxygen rich film is deposited before the insulation layer is formed to weaken the PG transistor and improve the write margin of the device. This allows for tuning the Vt for the NFET and VFET regions to improve the write margin.

Referring now to the drawings in which like numerals represent the same or similar elements and initially to FIG. 1, this figure depicts a simplified top-down (or plan) view of an example semiconductor device 100 to show the various gate lines (GATE), the locations of the active regions (RX) for the stacked FET, vias (VIA), different metal contacts CA/CB/CS, and the general location of the SRAM cell (CELL). FIG. 1 shows cut line A, which relates to the cross-sectional views shown in FIGS. 2A-2F and 3G. FIG. 1 also shows cut line B, which relates to the cross-sectional views shown in FIGS. 2G and 3A-3F.

Figure 2A:
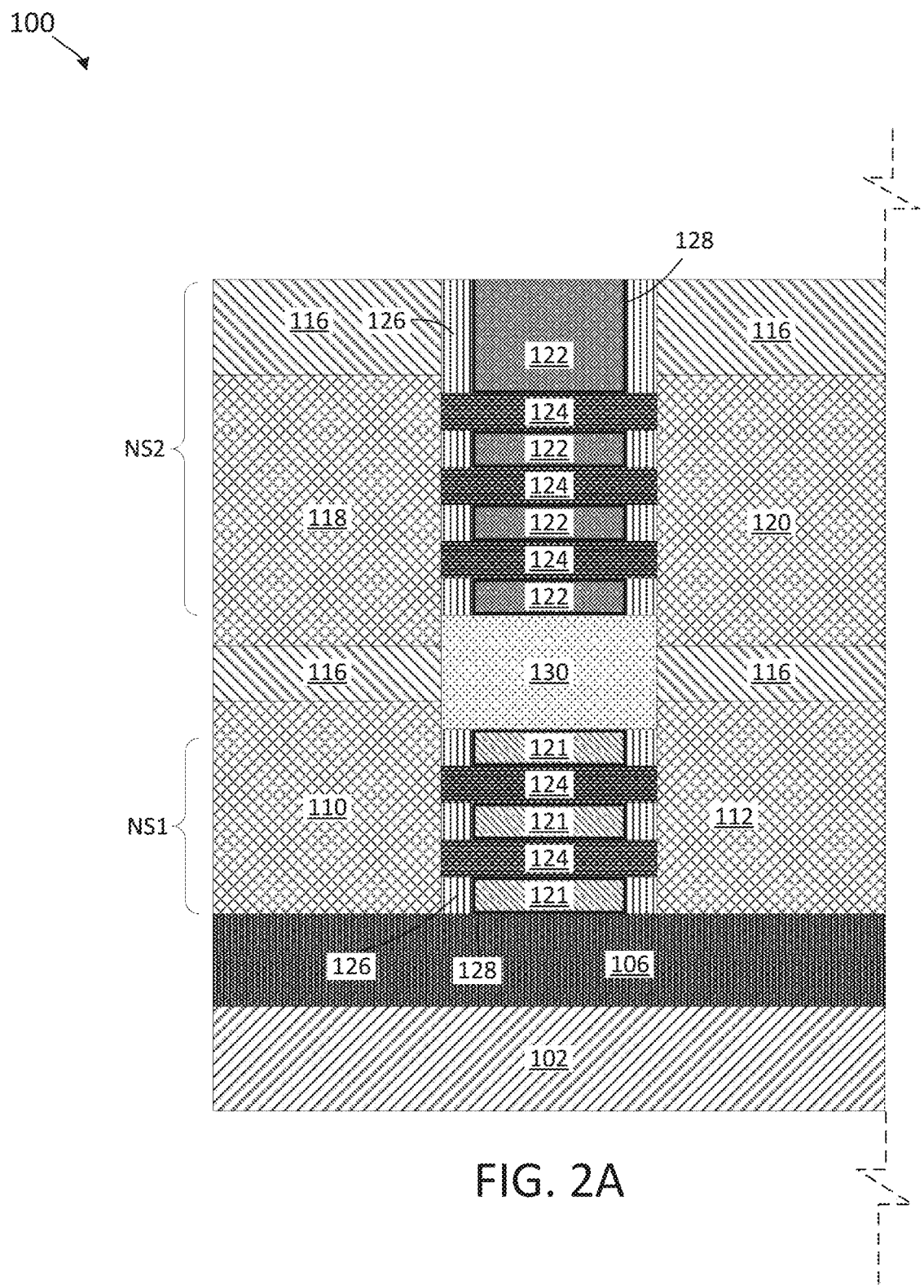
FIG. 2A is a partial cross-sectional view of a semiconductor device at an intermediate stage of the fabrication process and taken along the A line of FIG. 1, according to embodiments.

As shown in FIG. 2A, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. Other illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present application), the semiconductor substrate 102 is entirely composed of at least one semiconductor material. It should be appreciated that the substrate 102 may be comprised of any other suitable material(s) than those listed above.

As shown in FIG. 2A, one or more active device regions (i.e., doped-well regions 106) are formed above the semiconductor substrate 102. As shown in the cross-sectional views of FIG. 2G, in certain embodiments, shallow trench isolation (STI) regions 111 may be formed into the semiconductor substrate 102. In general, shallow trench isolation is an integrated circuit feature which prevents electric current leakage between adjacent semiconductor device components. STI is generally used on CMOS process technology nodes of 250 nanometers and smaller. STI regions are created early during the semiconductor device fabrication process before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

Referring again to FIG. 2A, the semiconductor device 100 includes a bottom nanosheet-containing material stack NS1, and a top nanosheet-containing material stack NS2, that are separated by a dielectric isolation layer 130. The bottom nanosheet-containing material stack NS1 includes alternating layers of an NFET work function metal (WFM) layer 121 and a semiconductor layer 124. The top nanosheet-containing material stack NS2 includes alternating layers of an PFET work function metal (WFM) layer 122 and a semiconductor layer 124.

Although the structure shown in FIG. 2A is shown at a stage in the manufacturing process after the bottom nanosheet-containing material stack NS1 and the top nanosheet-containing material stack NS2 have already been formed (for the sake of simplicity), one example process of forming these stacks is described below. In this example, a bottom nanosheet stack is formed on the substrate 102. The bottom nanosheet stack initially includes a sacrificial layer (not shown), followed by the formation of a semiconductor layer 124. In an example, the sacrificial layer is composed of silicon-germanium (e.g., SiGe35, or more generally, where the Ge ranges from about 15-35%). Next, the first (or bottommost) semiconductor layer 124 is formed on an upper surface of the first one of the sacrificial layers. In an example, the semiconductor layer 124 is composed of silicon. Several additional layers of the sacrificial layer and the semiconductor layer 124 are alternately formed. It should be appreciated that any suitable number of alternating layers of sacrificial layers and semiconductor layers 124 may be formed. Although not shown in the figures, a temporary layer (such as SiGe with Ge % 50~70%, which will be converted to the middle dielectric isolation (MDI) layer 130 later) is formed on the bottom nanosheet-containing material stack NS1 (or bottom nanosheet stack). Another sacrificial layer (i.e., formed on the bottom nanosheet-containing material stack NS1) may be comprised of the same or similar materials to the sacrificial layers formed in the bottom nanosheet-containing material stack NS1. In a process similar to that described above, a top nanosheet-containing material stack NS2 (or top nanosheet stack) is formed. It should be appreciated that the total number of alternating layers in the top nanosheet-containing material stack NS2 may be any suitable number.

In certain embodiments, the sacrificial layers have a vertical thickness ranging, for example, from approximately 3 nm to approximately 20 nm. In certain embodiments, the semiconductor layers 124 have a vertical thickness ranging, for example, from approximately 3 nanometers (nm) to approximately 10 nm. Although the range of 3-20 nm is cited as an example range of thickness, other thicknesses of these layers may be used. In certain examples, certain of the sacrificial layers and/or the semiconductor layers 124 may have different thicknesses relative to one another. Therefore, multiple epitaxial growth processes can be performed to form the sacrificial layers and the semiconductor layers 124.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers.

In certain examples, a dummy gate (or dummy polycrystalline (PC) layer) is formed. The dummy gate (not shown) may be formed by any suitable deposition technique known to one of skill in the art. In one example, the dummy gate is formed by depositing a thin $SiO_2$ dummy gate oxide layer (not shown), followed by depositing a layer of amorphous silicon (a-Si) as the dummy gate. The dummy gate may be composed of polycrystalline silicon (poly silicon), amorphous silicon, and/or an oxide, such as, $SiO_2$. Gate patterning may be performed by first patterning a gate hardmask (not shown) and then using the patterned gate hardmask to etch the dummy gates. After the dummy gate is formed, the exposed bottom and middle sacrificial layers (e.g., SiGe with Ge % 50~70%) are selectively removed, and a spacer material is conformally deposited, forming the gate spacer (not shown). After that, the stacked nanosheets at the source/drain regions which are not protected by gate hardmask and spacers are recessed in a horizontal direction, followed by inner spacer 126 formation (only two labeled in FIG. 2A for clarity). A selective etching process using, for example, a boron-based chemistry or a chlorine-based chemistry may be used, which selectively recesses the exposed portions of the sacrificial layers without significantly attacking the surrounding materials. Then, the inner spacers 126 are formed in the indents created by the removal of the portions of the sacrificial layers. An isotropic etching process may be performed to clean up the edges of the inner spacers 126.

A gate cut patterning process is performed to etch away the dummy gate in a gate cut region, followed by filling the gate cut region with dielectric material. Then, the dummy gate is selectively removed, followed by removal of (or release of) the SiGe material of the sacrificial layers.

After the material of the sacrificial layers has been released, a high-κ metal gate (HKMG) dielectric layer 128 and a gate electrode including a work function metal (WFM) are formed in the spaces created by the removal of the SiGe material of the sacrificial layers. In certain examples, the forming of the gate structure includes forming a continuous layer of gate dielectric material and a gate electrode material inside the gate opening. The continuous layer of gate dielectric material can include silicon oxide, or a dielectric material having a dielectric constant greater than 4.0 (such dielectric materials can be referred to as a high-K metal gate dielectric material). Illustrative examples of high-κ gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), and/or lead zinc niobite (Pb(Zn,Nb)O). The HKMG dielectric layer 128 dielectric material can further include dopants such as lanthanum (La), aluminum (Al) and/or magnesium (Mg). The continuous layer of the high-κ metal gate 128 can be formed utilizing a deposition process such as, for example, ALD, CVD, PECVD, or PVD. The continuous layer of the HKMG dielectric layer 128 is a conformal layer having a thickness which can range from 1 nm to 10 nm.

Referring back to FIG. 2A, an NFET work function metal (WFM) layer 121 is deposited in the spaces created by the previous removal of the sacrificial layers in the bottom nanosheet-containing material stack NS1. Also, a PFET WFM layer 122 is deposited in the spaces created by the previous removal of the sacrificial layers in the top nanosheet-containing material stack NS2. The different WFM layers form the gate electrode structures. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In solid-state physics, the work function is the minimum thermodynamic work (i.e., energy) needed to remove an electron from a solid to a point in the vacuum immediately outside the solid surface. Also, this energy (work function) is a measure of how firmly a particular metal holds its electrons. In general, the conduction band is the range of permissible energy values which an electron in a solid material can have that allows the electron to dissociate from a particular atom and become a free charge carrier in the material. In one embodiment, the work function of the n-type work function metal ranges from approximately 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from approximately 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. In general, the valence band is the range of permissible energy values that are the highest energies an electron can have and still be associated with a particular atom of a solid material. Examples of such materials that can effectuate a p-type threshold voltage shift include, but are not limited to, titanium nitride, and tantalum carbide, hafnium carbide, and combinations thereof. The layers of WFM are conformal layers which can be formed by a conformal deposition process such as, for example, ALD, CVD or PECVD. The layer of WFM layer can have a thickness in the range of approximately 1 nm to 20 nm, although other thicknesses above or below this range may be used as desired for a particular application. In the embodiment shown in FIG. 2A, the NFET work function metal (WFM) layer 121 is deposited in the spaces created by the previous removal of the sacrificial layers in the bottom nanosheet-containing material stack NS1, and the PFET WFM layer 122 is deposited in the spaces created by the previous removal of the sacrificial layers in the top nanosheet-containing material stack NS2.

As also shown in FIG. 2A, an epitaxial growth process is used to form a pull down (PD) source transistor 110 to the left of the bottom nanosheet-containing material stack NS1, and an epitaxial growth process is used to form a pull down (PD) drain transistor 112 to the right of the bottom nanosheet-containing material stack NS1. An interlayer dielectric (ILD) layer 116 is formed on the pull down (PD) source transistor 110 and on the pull down (PD) drain transistor 112. Then, an epitaxial growth process is used to form a pull up (PU) source transistor 118 to the left of the top nanosheet-containing material stack NS2, and an epitaxial growth process is used to form a pull up (PU) drain transistor 120 to the right of the top nanosheet-containing material stack NS2. Additional material of the ILD layer 116 is formed on the top of the pull up (PU) source transistor 118 and on the top of the pull up (PU) drain transistor 120. As shown in the expanded cross-sectional view of FIG. 2F, the four transistors (i.e., the pull down (PD) source transistor 110, the pull down (PD) drain transistor 112, the pull up (PU) source transistor 118, and the pull up (PU) drain transistor 120) form an inverter that is generally bounded by the dashed lined area shown in FIG. 2F.

Figure 2B:
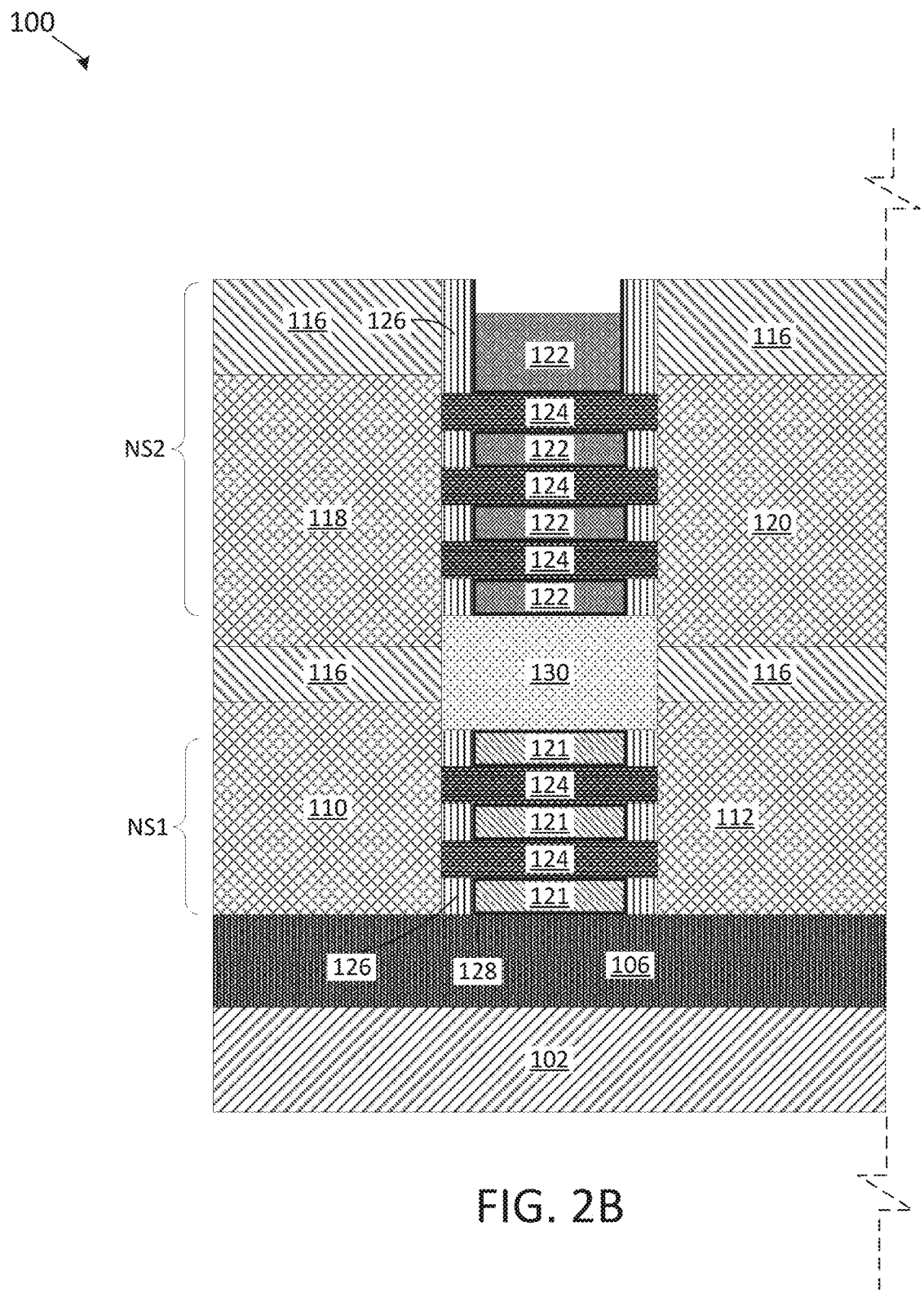
FIG. 2B is a partial cross-sectional view of the semiconductor device of FIG. 2A at a subsequent stage of the manufacturing process, according to embodiments.

Referring now to FIG. 2B, this figure is a partial cross-sectional view of the semiconductor device of FIG. 2A at a subsequent stage of the manufacturing process, according to embodiments. As shown in FIG. 2B, a suitable material removal process (e.g., etching) is utilized to recess the topmost PFET work function metal (WFM) layer 122 of the top nanosheet-containing material stack NS2. The etching can include an etching process such as, for example, wet etch, reactive ion etching, plasma etching, ion etching or laser ablation. The etching could include a wet chemical etching process in which one or more chemical etchants are used to remove upper portions of the topmost PFET WFM layer 112. The dry and wet etching processes can have etching parameters than can be tunes, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include tetrafluoromethane ($CF_4$), nitrogen trifluoride ($NF_3$), sulfur hexafluoride ($SF_6$), helium (He), and chlorine trifluoride ($ClF_3$). Dry etching can also be performed anisotropically using such mechanisms as DRIE (deep reactive-ion etching). As shown in FIG. 2B, the etching is only performed partially through a thickness of the topmost PFET work function metal (WFM) layer 122 of the top nanosheet-containing material stack NS2.

Figure 2C:
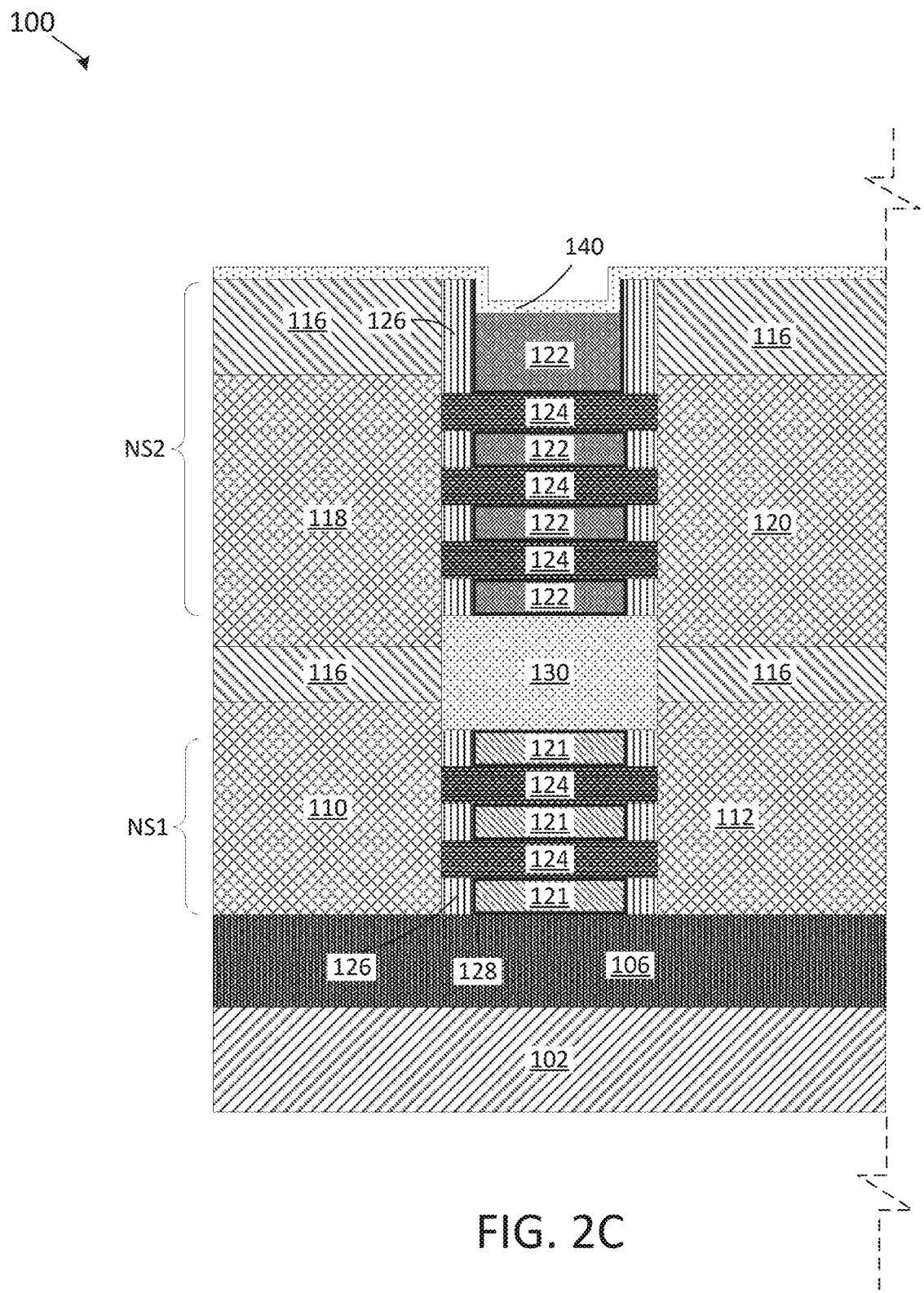
FIG. 2C is a partial cross-sectional view of the semiconductor device of FIG. 2B at a subsequent stage of the manufacturing process, according to embodiments.

Referring now to FIG. 2C, this figure is a partial cross-sectional view of the semiconductor device of FIG. 2B at a subsequent stage of the manufacturing process, according to embodiments. As shown in FIG. 2C, an oxygen blocking layer 140 is formed on the upper surfaces of the ILD layer 116 and the recessed topmost PFET work function metal (WFM) layer 122 of the top nanosheet-containing material stack NS2. The oxygen blocking layer 140 may be comprised of, for example, TiN. However, it should be appreciated that other suitable materials may be used for the oxygen blocking layer 140 other than TiN. Blocking oxygen to the WFM work function metal (WFM) layer 122 may decrease the NFET Vt of the top nanosheet-containing material stack NS2, and may increase the PFET Vt of the bottom nanosheet-containing material stack NS1. By blocking oxygen to the WFM at the pull up (PU) transistor and the pull down (PD) transistor, a weaker PU transistor and a stronger PD transistor may be achieved. In these embodiments, the oxygen blocking layer 140, for example, can be formed to weaken the PU transistor and strengthen the PD transistor. This allows for tuning the Vt for the NFET and VFET regions to improve the write margin (WRM).

Figure 2D:
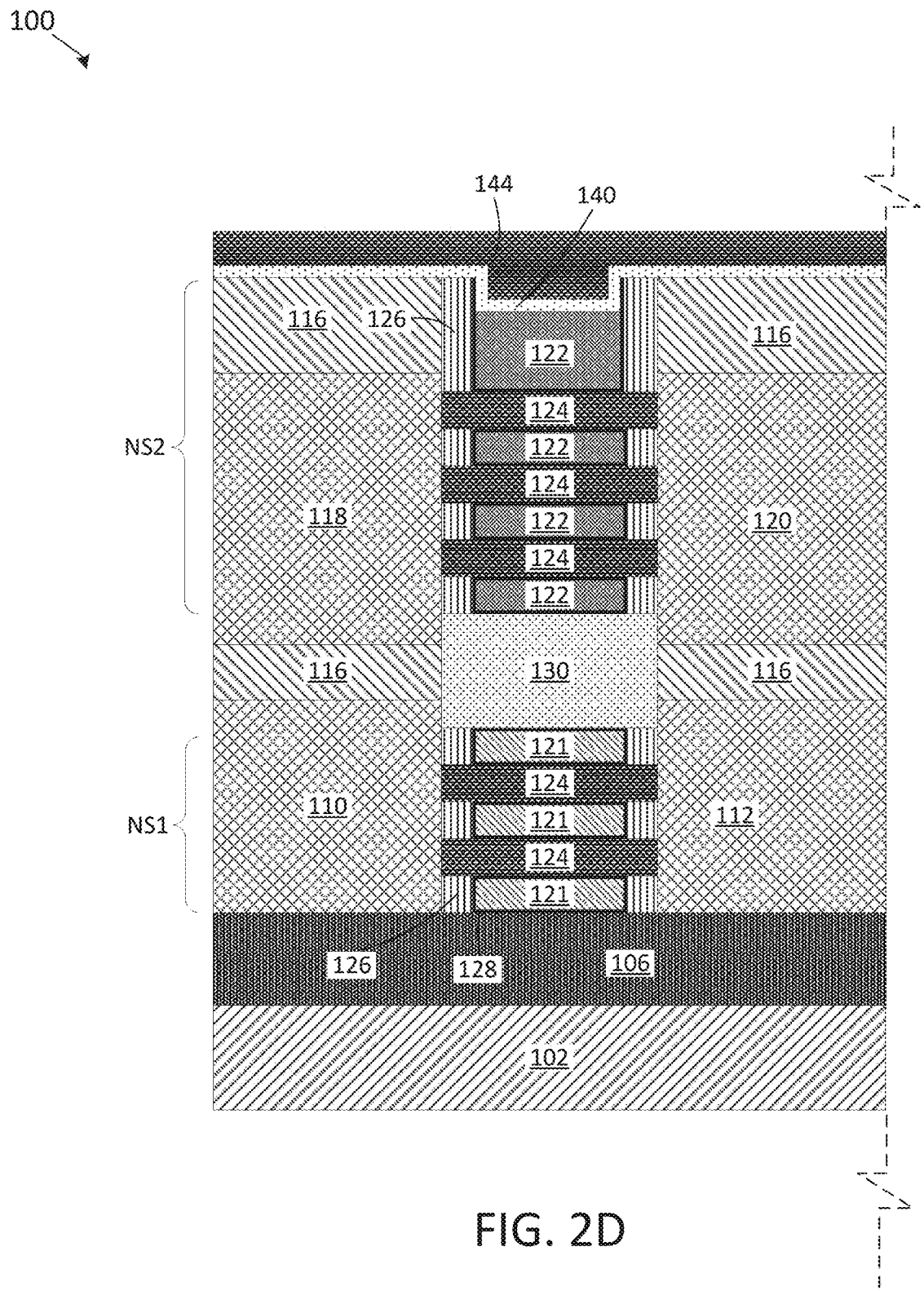
FIG. 2D is a partial cross-sectional view of the semiconductor device of FIG. 2C at a subsequent stage of the manufacturing process, according to embodiments.

Referring now to FIG. 2D, this figure is a partial cross-sectional view of the semiconductor device of FIG. 2C at a subsequent stage of the manufacturing process, according to embodiments. As shown in FIG. 2D, after the formation of the oxygen blocking layer 140, an insulation layer 144 is formed on the oxygen blocking layer 140. The insulation layer 144 may comprise any suitable insulating material or combination of materials.

Figure 2E:
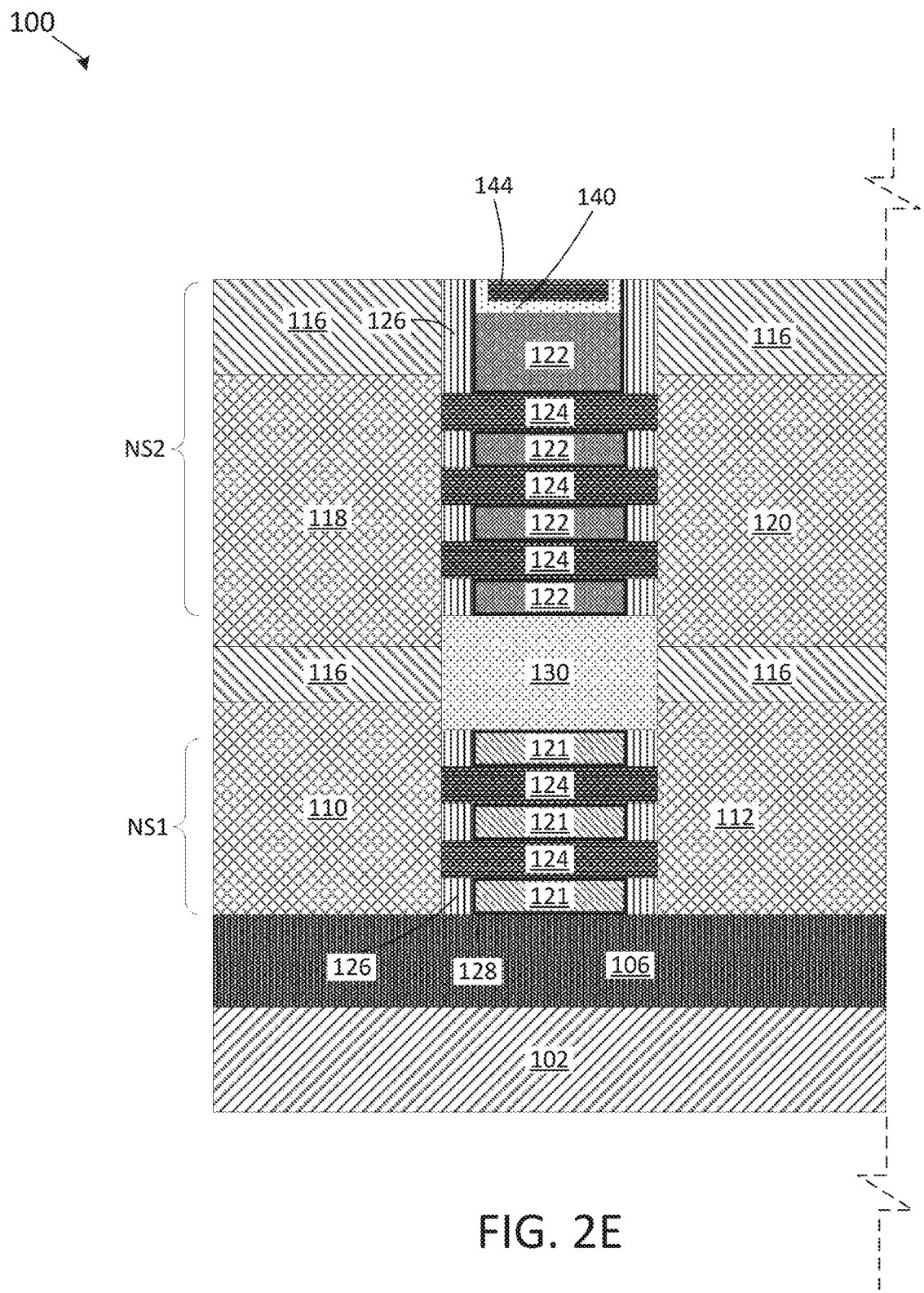
FIG. 2E is a partial cross-sectional view of the semiconductor device of FIG. 2D at a subsequent stage of the manufacturing process, according to embodiments.

Referring now to FIG. 2E, this figure is a partial cross-sectional view of the semiconductor device of FIG. 2D at a subsequent stage of the manufacturing process, according to embodiments. As shown in FIG. 2E, a suitable material removal process such as CMP is used to remove excess material of the insulation layer 144 and the oxygen blocking layer 140, and to expose the upper surfaces of the ILD layer 116.

Figure 2F:
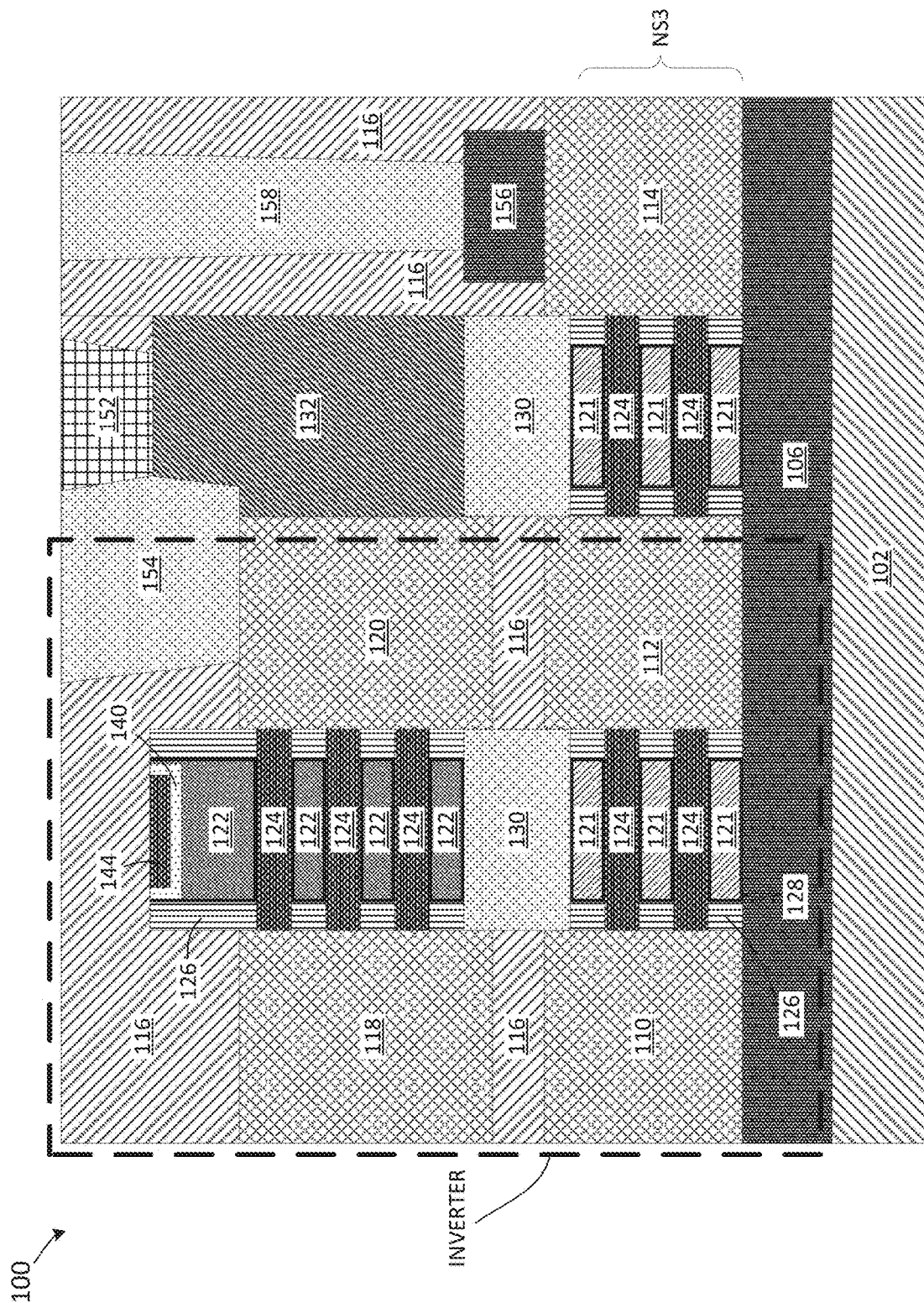
FIG. 2F is a cross-sectional view of the semiconductor device of FIG. 2E, according to embodiments.

FIG. 2F is an expanded cross-sectional view of the semiconductor device of FIG. 2E, according to embodiments. As shown in FIG. 2F, additional components of the SRAM device are shown to give context to the semiconductor device 100. The dashed dotted line shows the location inverter structure that is the focus of FIGS. 2A-2E. A third nanosheet-containing material stack NS3 is formed in the NFET region to the right side of the pull down (PD) drain transistor 112. The third nanosheet-containing material stack NS3 has similar layers to the bottom nanosheet-containing material stack NS1 (shown in FIG. 2E), which include alternating layers of NFET work function metal (WFM) layers 121 and semiconductor layers 124. An epitaxial layer 114 (or a source/drain epitaxial layer) is formed to the right of the third nanosheet-containing material stack NS3, and is formed generally to the same height as the pull down (PD) source transistor 110 and the pull down (PD) drain transistor 112. The dielectric isolation layer 130 is formed on top of the third nanosheet-containing material stack NS3. As shown in FIG. 2F, an insulation fill layer 132 is formed on the dielectric isolation layer 130. Various metal contacts such as the CB jumper 152 and metal contact 154 may be formed to electrically connect the various components of the SRAM device. A second metal contact 156 is formed on the epitaxial layer 114, and a word line 158 is formed on the second metal contact 156.

Figure 2G:
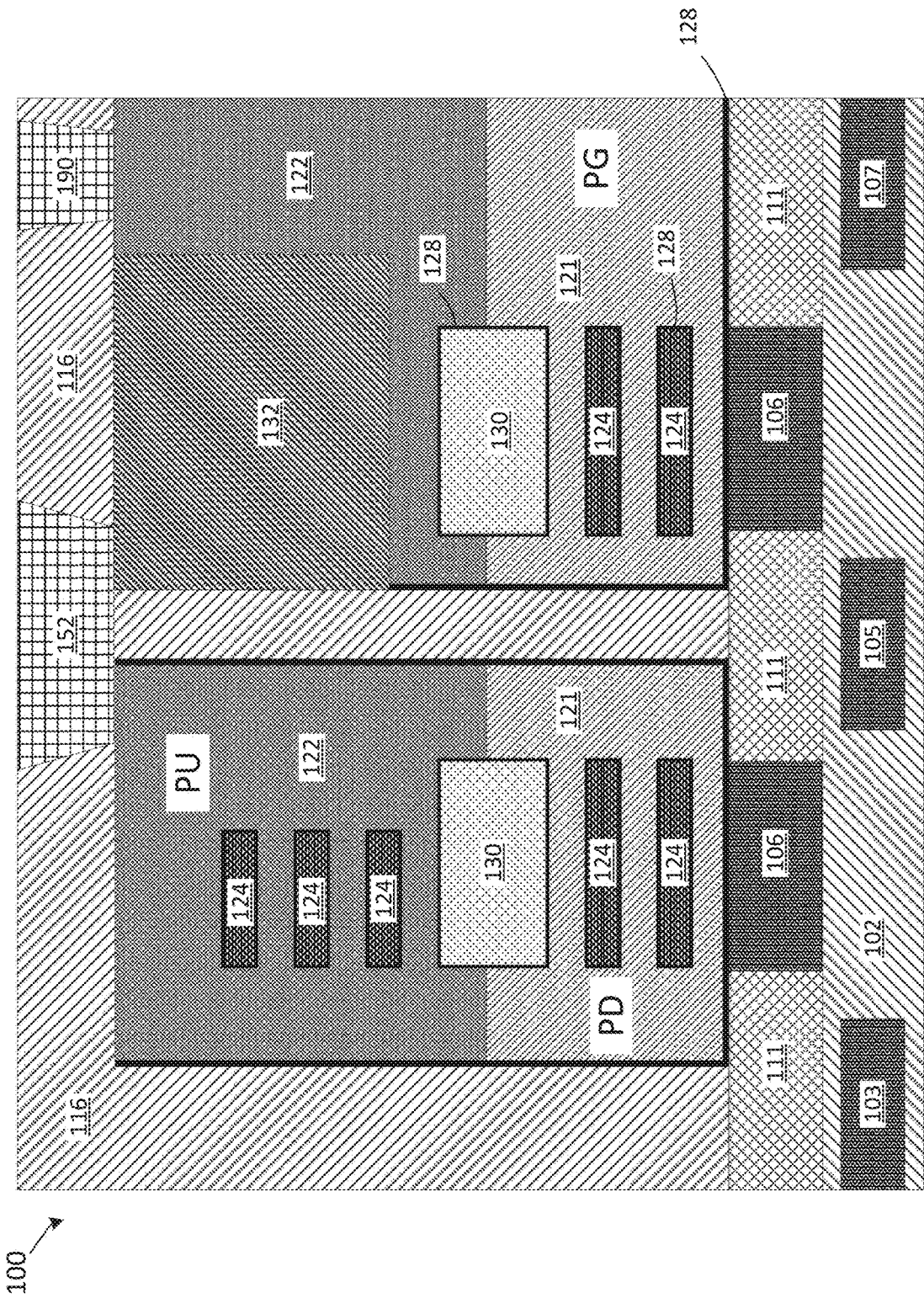
FIG. 2G is a cross-sectional view of the semiconductor device of FIG. 2F taken along the B line of FIG. 1, according to embodiments.

Referring now to FIG. 2G, this figure is a cross-sectional view of the semiconductor device of FIG. 2F taken along the B line of FIG. 1, according to embodiments. As shown in FIG. 2G, various contacts could be formed. These contacts includes a first VDD contact 103 (i.e., a contact to supply a drain voltage to the SRAM device), a VSS contact 105 (i.e., a contact to supply a source voltage to the SRAM device), and a second VDD contact 107. Well regions 106 are formed into the semiconductor substrate 102. In general, shallow trench isolation is an integrated circuit feature which prevents electric current leakage between adjacent semiconductor device components.

As shown in FIG. 2G, an insulation fill layer 132 is formed into a gate etch region of the PFET work function metal (WFM) layer 122. Unlike the embodiments related to FIGS. 3A-3G (as described in detail below), there is not an oxygen rich layer 280 formed between the insulation fill layer 132. Thus, it should be appreciated that the oxygen blocking layer 140 allows for blocking oxygen to the WFM work function metal (WFM) layer 122 and may decrease the NFET Vt of the top nanosheet-containing material stack NS2. The oxygen blocking layer 140 may also increase the PFET Vt of the bottom nanosheet-containing material stack NS1. By blocking oxygen to the WFM at the pull up (PU) transistor and the pull down (PD) transistor, a weaker PU transistor and a stronger PD transistor may be achieved. In these embodiments, the oxygen blocking layer 140, for example, can be formed to weaken the PU transistor and strengthen the PD transistor. This allows for tuning the Vt for the NFET and VFET regions to improve the write margin (WRM).

As also shown in FIG. 2G, the CB jumper 152 is formed on the PFET WFM layer 122, on portions of the ILD layer 116, and on the insulation fill layer 132. A word line 190 is provided on the PFET WFM layer 122 and to the right of the insulation fill layer 132. As seen in FIG. 2G, the HKMG dielectric layer 128 is also provided as a layer between the ILD layer 116 and the NFET WFM layer 121, as well as between the ILD layer 116 and the PFET WFM layer 122.

Referring now to FIGS. 3A-3G, embodiments of a semiconductor device 200 (and methods of manufacturing the semiconductor device) that includes an SRAM structure with an oxygen rich layer 280 are provided. It should be appreciated that the semiconductor device 200 of the embodiments shown in FIGS. 3A-3G, and the method of manufacturing same, are similar in many respects compared to the embodiments related to FIGS. 2A-2G, with a difference being that the oxygen blocking layer 140 from FIGS. 2A-2G is not included in these embodiments. Another difference between these embodiments in the inclusion of the oxygen rich layer 280 that is between the PFET WFM layer 222 and the insulation fill layer 232. That is, the embodiments of FIGS. 2A-2G provide a different structure for Vt tuning by including an oxygen rich layer 280 that supplies oxygen rather than a structure for blocking oxygen. It should be further appreciated that the top-down view of FIG. 1 applies generally to both the embodiments of FIGS. 2A-2G and the embodiments of FIGS. 3A-3G.

Figure 3A:
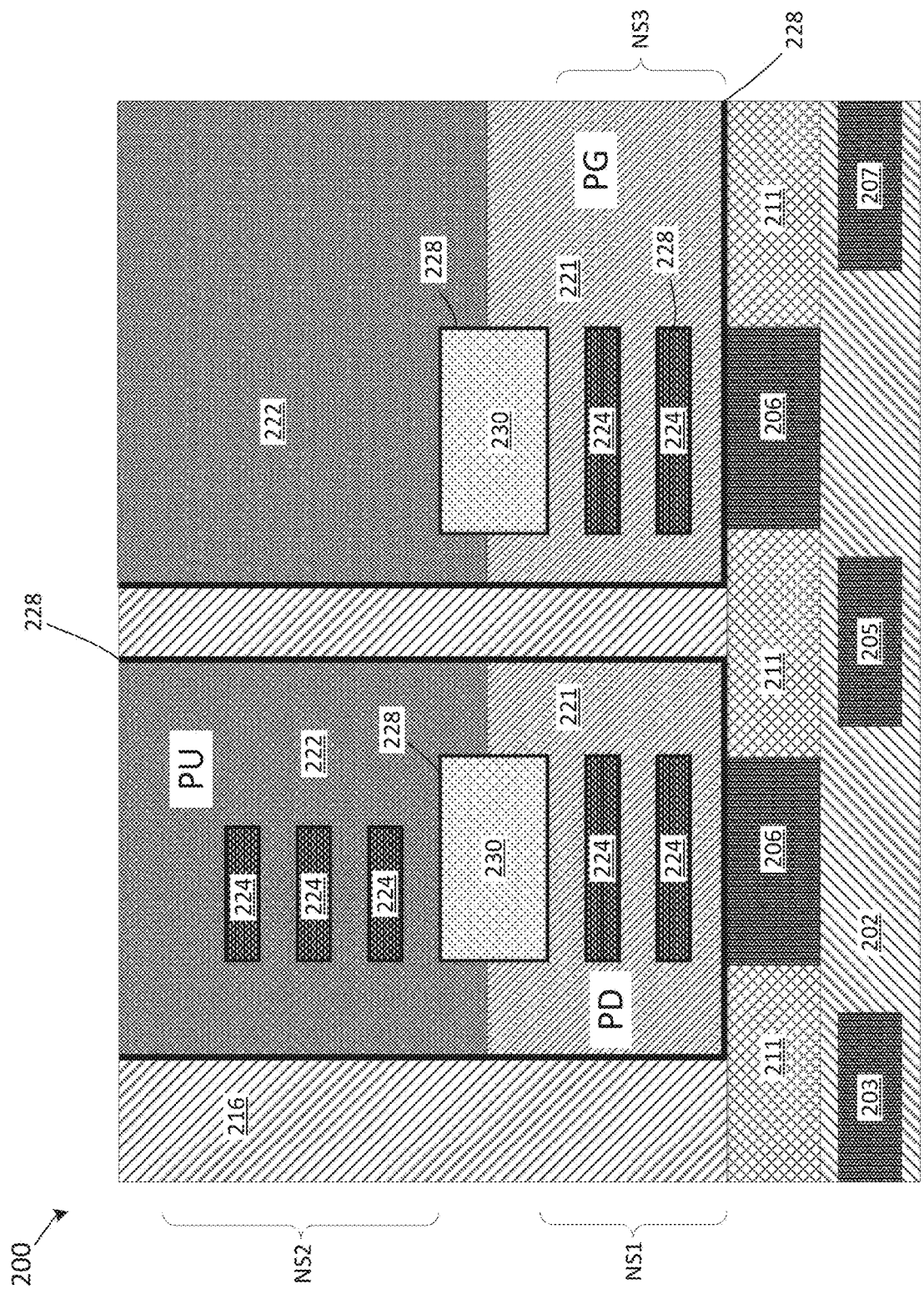
FIG. 3A is a cross-sectional view of a semiconductor device at an intermediate stage of the fabrication process and taken along the B line of FIG. 1, according to embodiments.

Referring initially to FIG. 3A, this figure is a cross-sectional view of a semiconductor device at an intermediate stage of the fabrication process and taken along the B line of FIG. 1, according to embodiments. As shown in FIG. 3A, a substrate 202 is provided. The substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. Other illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present application), the semiconductor substrate 202 is entirely composed of at least one semiconductor material. It should be appreciated that the substrate 202 may be comprised of any other suitable material(s) than those listed above.

As shown in FIG. 3A, various contacts are formed in the substrate 202 and are surrounded by an insulator (not shown). These contacts include a first VDD contact 203 (i.e., a contact to supply a drain voltage to the SRAM device), a VSS contact 205 (i.e., a contact to supply a source voltage to the SRAM device), and a second VDD contact 207. Well regions 206 may be formed into the semiconductor substrate 202. In certain embodiments, STI regions 211 are formed in the semiconductor substrate 202.

Although the structure shown in FIG. 3A is shown at a stage in the manufacturing process after the bottom nanosheet-containing material stack NS1, the top nanosheet-containing material stack NS2, and the third nanosheet-containing material stack NS3 have already been formed (for the sake of simplicity), an example process for forming these structures is described above with respect to FIG. 2A, and is not repeated here for the sake of simplicity.

As shown in FIG. 3A, the pull down (PD) section of the SRAM device is formed in the NFET region of the bottom nanosheet-containing material stack NS1. The bottom nanosheet-containing material stack NS1 includes a plurality of semiconductor layers 224 embedded within the NFET WFM layer 221. These semiconductor layers 224 are surrounded by the HKMG dielectric layers 228 that are indicated by the solid black lines. As also shown in FIG. 3A, the pass gate (PG) section of the SRAM device is formed in the NFET region of the third nanosheet-containing material stack NS3. The third nanosheet-containing material stack NS3 includes a plurality of semiconductor layers 224 embedded within the NFET WFM layer 221, similar to the bottom nanosheet-containing material stack NS1. These semiconductor layers 224 in the pass gate region (PG) are also surrounded by the HKMG dielectric layer 228 that are indicated by the solid black lines. As also shown in FIG. 3A, the pull up (PU) section of the SRAM device is formed in the PFET region of the top nanosheet-containing material stack NS2. The top nanosheet-containing material stack NS2 includes a plurality of semiconductor layers 224 embedded within the PFET WFM layer 222. These semiconductor layers 224 in the pull up (PG) region are also surrounded by the HKMG dielectric layers 228 that are indicated by the solid black lines. As shown in FIG. 3A, a dielectric isolation layer 230 is formed above the bottom nanosheet-containing material stack NS1 and above the third nanosheet-containing material stack NS3. An ILD layer 216 is formed around and between the PU/PD/PG regions.

Figure 3B:
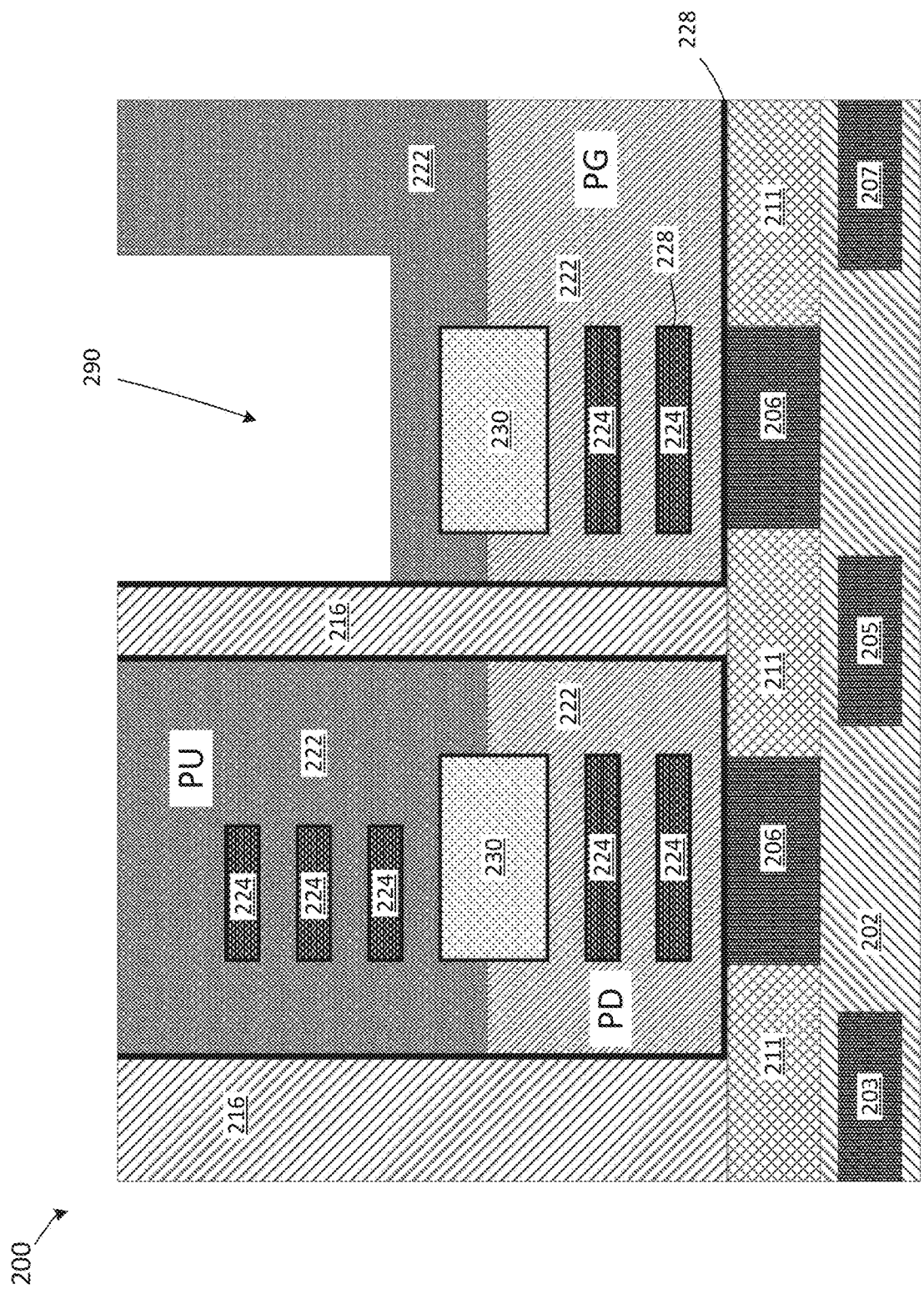
FIG. 3B is a cross-sectional view of the semiconductor device of FIG. 3A at a subsequent stage of the manufacturing process, according to embodiments.

FIG. 3B is a cross-sectional view of the semiconductor device of FIG. 3A at a subsequent stage of the manufacturing process, according to embodiments. As shown in FIG. 3B, a recess 290 is formed into the PFET WFM layer 222 above the PG region. The etching can include an etching process such as, for example, wet etch, reactive ion etching, plasma etching, ion etching or laser ablation. The etching could include a wet chemical etching process in which one or more chemical etchants are used to remove upper portions of the PFET WFM layer 222. The dry and wet etching processes can have etching parameters than can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include tetrafluoromethane ($CF_4$), nitrogen trifluoride ($NF_3$), sulfur hexafluoride (SF6), helium (He), and chlorine trifluoride (ClF3). Dry etching can also be performed anisotropically using such mechanisms as DRIE (deep reactive-ion etching). As shown in FIG. 3B, the etching is only performed partially through a thickness of the topmost PFET work function metal (WFM) layer 222 above the PG region.

Figure 3C:
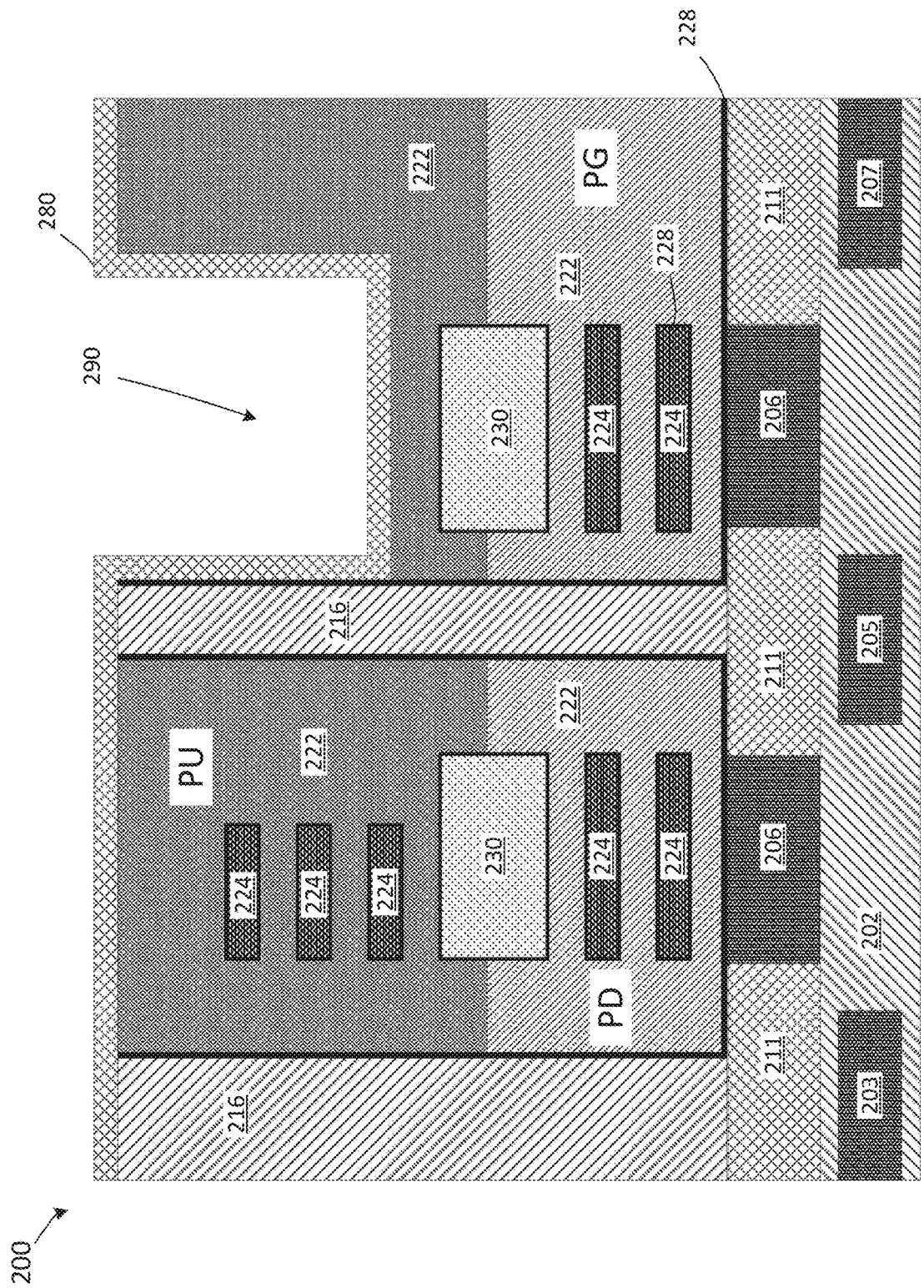
FIG. 3C is a partial cross-sectional view of the semiconductor device of FIG. 3B at a subsequent stage of the manufacturing process, according to embodiments.

FIG. 3C is a partial cross-sectional view of the semiconductor device 200 of FIG. 3B at a subsequent stage of the manufacturing process, according to embodiments. As shown in FIG. 3C, after the formation of the recess 290, an oxygen rich layer 280 is conformally deposited over the semiconductor device 200, and covers portions of the ILD layer 216 and the PFET WFM layers 222 above the PU region and the PG region. In certain of the embodiments described herein, driving more oxygen to the work function metal (WFM) may increase the NFET Vt and decrease the PFET Vt. By driving more oxygen to the WFM at the pass gate (PG) transistor, a weaker PG transistor may be achieved. In these embodiments, as will be described in further detail herein, an oxygen rich film is deposited before an insulation fill layer 232 is formed to weaken the PG transistor and improve the write margin of the device. This allows for the tuning of the Vt for the NFET and VFET regions to improve the write margin.

Figure 3D:
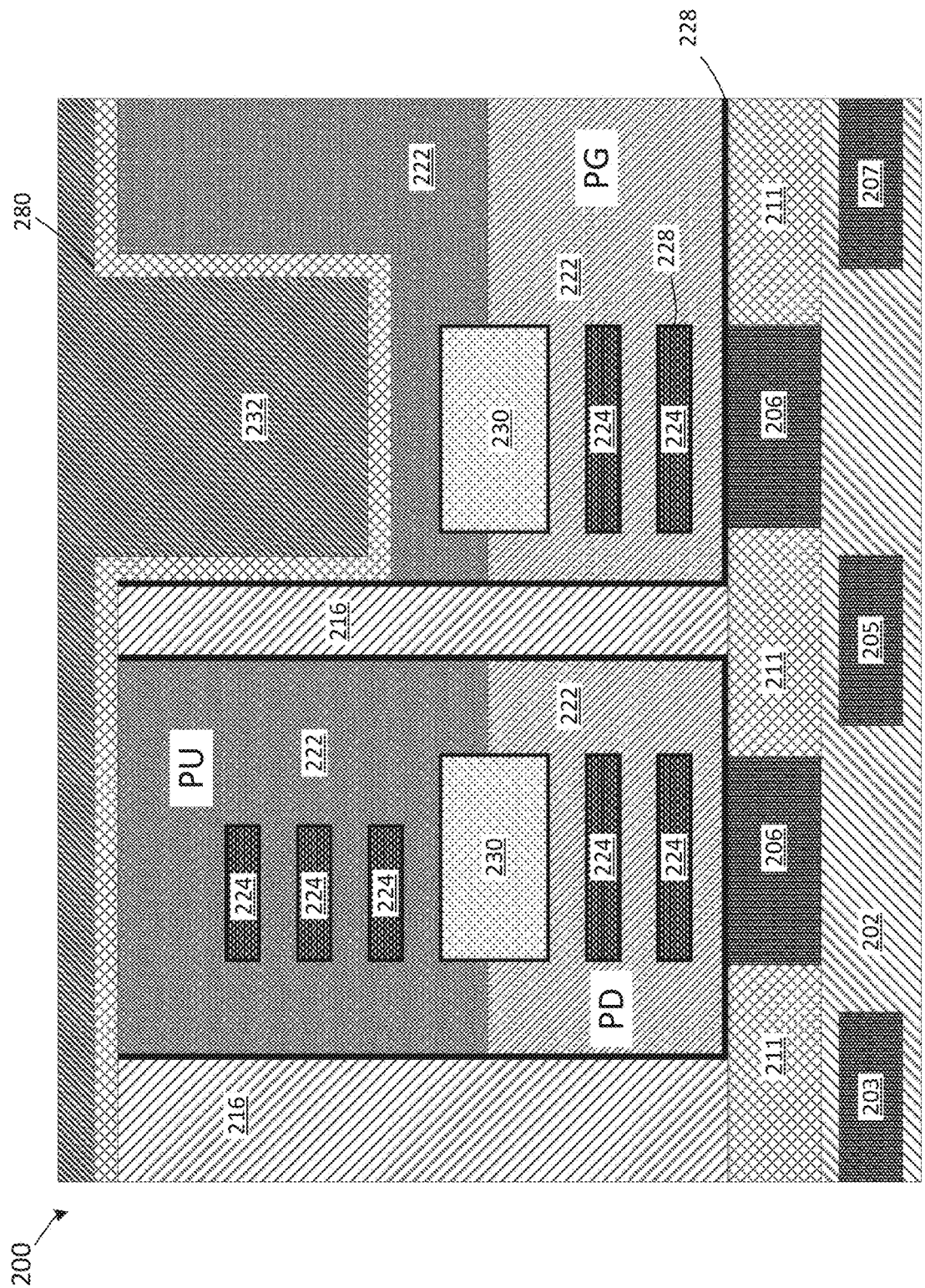
FIG. 3D is a partial cross-sectional view of the semiconductor device of FIG. 3C at a subsequent stage of the manufacturing process, according to embodiments.

Referring now to FIG. 3D, this figure is a partial cross-sectional view of the semiconductor device 200 of FIG. 3C at a subsequent stage of the manufacturing process, according to embodiments. As shown in FIG. 3D, after the formation of the oxygen rich layer 280, an insulation fill layer 232 is formed on the oxygen rich layer 280 to fill the remainder of the recess 290. The insulation fill layer 232 may comprise any suitable insulating material or combination of materials.

Figure 3E:
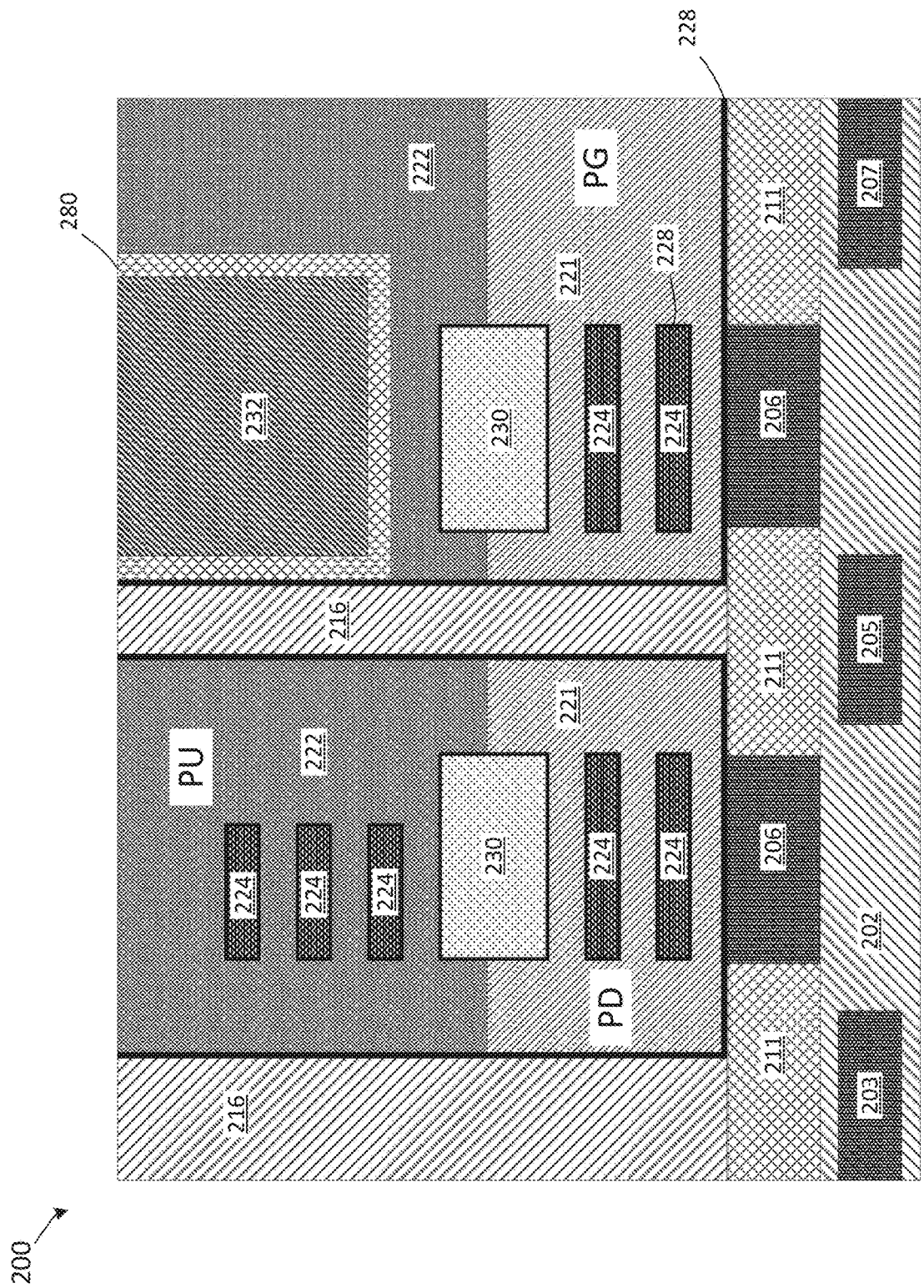
FIG. 3E is a partial cross-sectional view of the semiconductor device of FIG. 3D at a subsequent stage of the manufacturing process, according to embodiments.

Referring now to FIG. 3E, this figure is a partial cross-sectional view of the semiconductor device 200 of FIG. 3D at a subsequent stage of the manufacturing process, according to embodiments. As shown in FIG. 3E, a suitable material removal process such as CMP is used to remove excess material of the insulation fill layer 232 and the oxygen rich layer 280, and to expose the upper surfaces of the ILD layer 216.

Figure 3F:
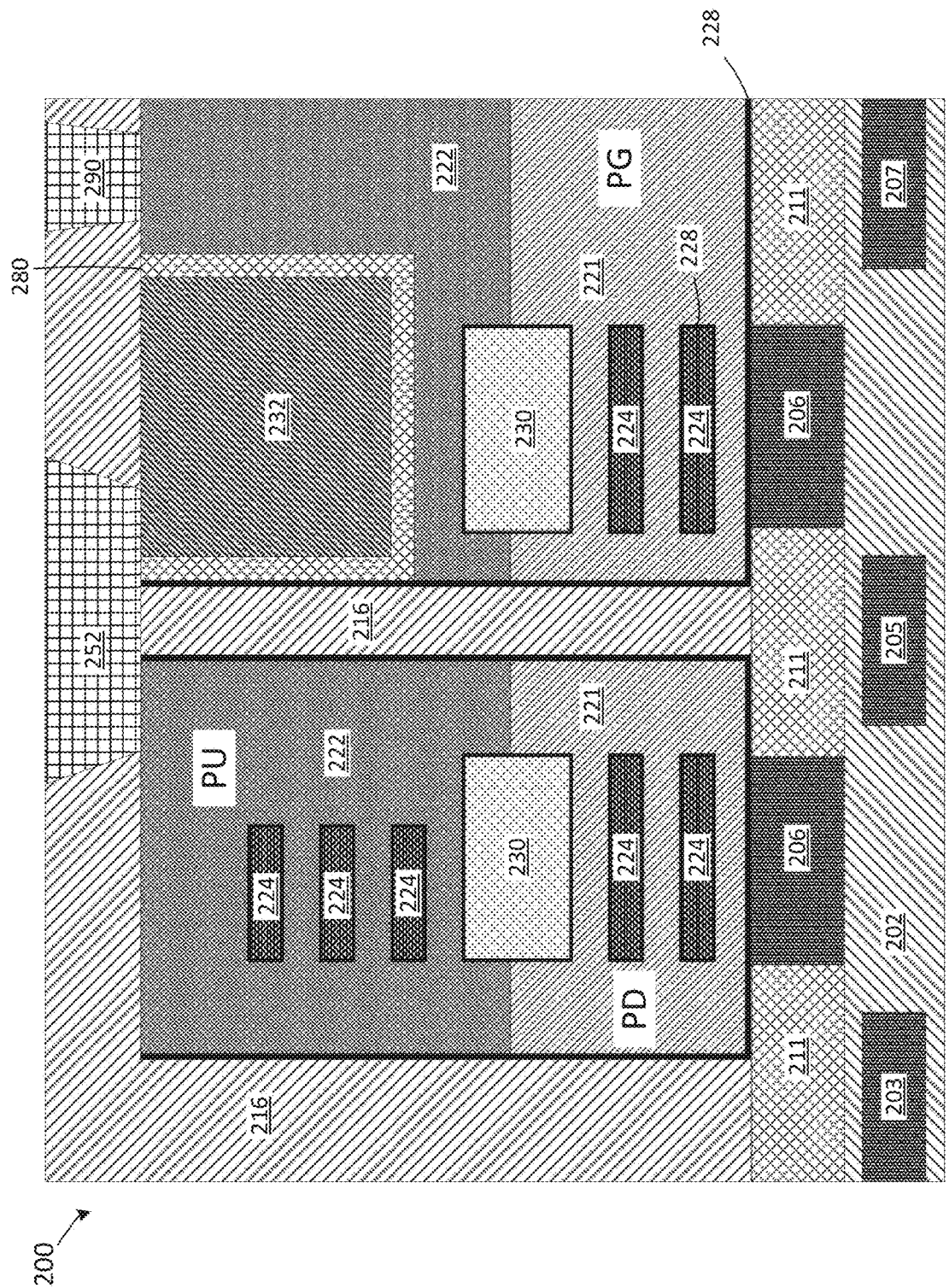
FIG. 3F is a partial cross-sectional view of the semiconductor device of FIG. 3E at a subsequent stage of the manufacturing process, according to embodiments.

Referring now to FIG. 3F, this figure is a partial cross-sectional view of the semiconductor device 200 of FIG. 3E at a subsequent stage of the manufacturing process, according to embodiments. As shown in FIG. 3F, additional material of the ILD layer 216 is deposited on the top of the semiconductor device 200. Then vias (not shown) are formed in the ILD layer 216. A CB jumper 252 metal contact is formed in a first one of the vias, and a word line 290 is formed in a second one of the vias. The material for the CB jumper 252 and the word line 290 may be any suitable electrically conductive metal(s). As shown in FIG. 3F, the CB jumper 252 at least partially overlaps with the PFET WFM layer 222 in the PU region and the insulation fill layer 232.

Figure 3G:
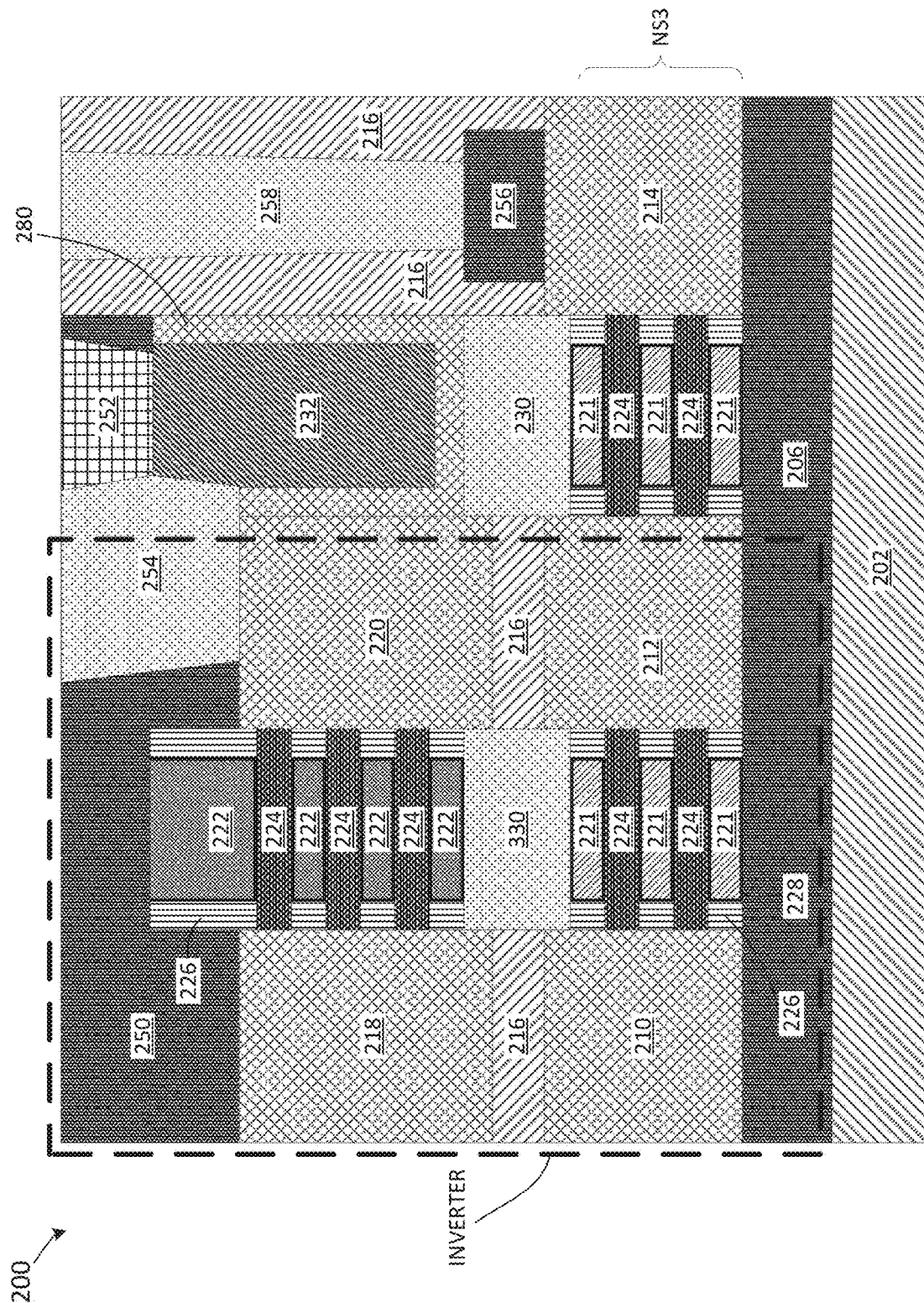
FIG. 3G is a cross-sectional view of the semiconductor device of FIG. 3F taken along the A line of FIG. 1, according to embodiments.

FIG. 3G is a cross-sectional view of the semiconductor device of FIG. 3F taken along the A line of FIG. 1, according to embodiments. As shown in FIG. 3G, additional components of the SRAM device are shown to give context to the semiconductor device 200. The dashed dotted line shows the location inverter structure of the SRAM device. A third nanosheet-containing material stack NS3 is formed in the NFET region to the right side of the pull down (PD) drain transistor 212. The third nanosheet-containing material stack NS3 has similar layers to the bottom nanosheet-containing material stack NS1 (shown in FIG. 3E), which include alternating layers of NFET work function metal (WFM) layers 221 and semiconductor layers 224. An epitaxial layer 214 (or a source/drain epitaxial layer) is formed to the right of the third nanosheet-containing material stack NS3, and is formed generally to the same height as the pull down (PD)

source transistor 210 and the pull down (PD) drain transistor 212. The dielectric isolation layer 230 is formed on top of the third nanosheet-containing material stack NS3. As shown in FIG. 3G, the oxygen rich film 280 is formed on the dielectric isolation layer 230, and an insulation fill layer 232 is formed on the oxygen rich film 280. Various metal contacts such as the CB jumper 252 and metal contact 254 may be formed to electrically connect the various components of the SRAM device. A second metal contact 256 is formed on the epitaxial layer 214, and a word line 258 is formed on the second metal contact 256.

In certain of the embodiments described herein as exemplified by FIGS. 3A-3G, driving more oxygen to the work function metal (WFM) may increase the NFET Vt and decrease the PFET Vt. By driving more oxygen to the WFM at the pass gate (PG) transistor, a weaker PG transistor may be achieved. In these embodiments, as will be described in further detail herein, an oxygen rich film 280 is deposited before the insulation fill layer 232 is formed to weaken the PG transistor and improve the write margin of the device. This allows for the tuning of the Vt for the NFET and VFET regions to improve the write margin.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a first stacked field effect transistor (FET) structure in a first device area, the first stacked FET structure comprising a first pull down (PD) transistor, and a first pull up (PU) transistor disposed over the first PD transistor;
    a first metal gate that is shared by the first PD transistor and the first PU transistor; and
    an oxygen blocking layer formed on the first metal gate.

2. The semiconductor device of claim 1, wherein the oxygen blocking layer includes one or more materials that decrease the first PD transistor threshold voltage (Vt) and increase the first PU transistor Vt.

3. The semiconductor device of claim 2, wherein the oxygen blocking layer comprises TiN.

4. The semiconductor device of claim 2, further comprising an insulation layer formed on the oxygen blocking layer.

5. The semiconductor device of claim 1, wherein the first PD transistor is a PD source transistor in an NFET region, and wherein the first PU transistor is a PU source transistor in a PFET region.

6. The semiconductor device of claim 5, further comprising a second stacked FET structure in a second device area, the second stacked FET structure including a second PD transistor, and a second PU transistor disposed over the second PD transistor,
    wherein the first metal gate is also shared by the second PD transistor and the second PU transistor.

7. The semiconductor device of claim 6, wherein the second PD transistor is a PD drain transistor in the NFET region, and wherein the first PU transistor is a PU source transistor in the PFET region.

8. The semiconductor device of claim 1, wherein the first metal gate includes alternating layers of active semiconductor layers and work function metal (WFM) layers.

9. The semiconductor device according to claim 1, wherein the first metal gate is a nanosheet-containing material stack.

10. The semiconductor device according to claim 1, further comprising a pass gate transistor comprising a second metal gate.

11. A semiconductor device comprising:
    a first stacked field effect transistor (FET) structure in a first device area, the first stacked FET structure comprising a first pull down (PD) transistor, and a first pull up (PU) transistor disposed over the first PD transistor;
    a first metal gate that is shared by the first PD transistor and the first PU transistor;
    a pass gate transistor comprising a second metal gate; and
    an oxygen rich layer provided on the second metal gate.

12. The semiconductor device of claim 11, wherein the oxygen rich layer includes one or more materials that increase the PG transistor threshold voltage (Vt).

13. The semiconductor device of claim 12, wherein the oxygen rich layer comprises TiN.

14. The semiconductor device of claim 12, further comprising an insulation fill layer formed on the oxygen blocking layer.

15. The semiconductor device of claim 11, wherein the first PD transistor is a PD source transistor in an NFET region, and wherein the first PU transistor is a PU source transistor in a PFET region.

16. The semiconductor device of claim 15, further comprising a second stacked FET structure in a second device area, the second stacked FET structure including a second PD transistor, and a second PU transistor disposed over the second PD transistor,
    wherein the first metal gate is also shared by the second PD transistor and the second PU transistor.

17. The semiconductor device of claim 16, wherein the second PD transistor is a PD drain transistor in the NFET region, and wherein the first PU transistor is a PU source transistor in the PFET region.

18. The semiconductor device of claim 11, wherein the first metal gate and the second metal gate each include alternating layers of active semiconductor layers and work function metal (WFM) layers.

19. The semiconductor device according to claim 11, wherein the first metal gate and the second metal gate are nanosheet-containing material stacks.

20. The semiconductor device according to claim 11, wherein the pass gate transistor includes an NFET WFM layer and a PFET WFM layer.

* * * * *